(12) United States Patent
Gottschalk et al.

(10) Patent No.: US 11,119,471 B2
(45) Date of Patent: Sep. 14, 2021

(54) METHOD FOR OPERATING A COMPONENT THAT IS CYCLICALLY LOADED DURING OPERATION

(71) Applicant: Siemens Aktiengesellschaft, Munich (DE)

(72) Inventors: Hanno Gottschalk, Bochum (DE); Mohamed Saadi, Wuppertal (DE); Sebastian Schmitz, Berlin (DE)

(73) Assignee: SIEMENS ENERGY GLOBAL GMBH & CO. KG, Munich (DE)

( * ) Notice: Subject to any disclaimer, the term of this patent is extended or adjusted under 35 U.S.C. 154(b) by 267 days.

(21) Appl. No.: 16/346,303

(22) PCT Filed: Nov. 2, 2017

(86) PCT No.: PCT/EP2017/078045
§ 371 (c)(1),
(2) Date: Apr. 30, 2019

(87) PCT Pub. No.: WO2018/086978
PCT Pub. Date: May 17, 2018

(65) Prior Publication Data
US 2019/0317487 A1    Oct. 17, 2019

(30) Foreign Application Priority Data
Nov. 9, 2016    (DE) ..................... 10 2016 221 928.6

(51) Int. Cl.
*G05B 23/02* (2006.01)
*G01B 11/00* (2006.01)
(Continued)

(52) U.S. Cl.
CPC .......... *G05B 23/024* (2013.01); *G01B 11/005* (2013.01); *G01B 11/2441* (2013.01); *G01M 15/14* (2013.01); *G06N 7/005* (2013.01)

(58) Field of Classification Search
CPC .................. G05B 23/02; G05B 23/024; G05B 2219/24074; G05B 23/0283;
(Continued)

(56) References Cited

U.S. PATENT DOCUMENTS

| 4,680,761 | A | * | 7/1987 | Burkness | ....... G01R 31/318505 |
| | | | | | 714/724 |
| 5,970,400 | A | * | 10/1999 | Dwyer | ..................... H04B 1/40 |
| | | | | | 455/254 |

(Continued)

FOREIGN PATENT DOCUMENTS

| CN | 103344515 A | 10/2013 |
| CN | 104089760 A | 10/2014 |

(Continued)

OTHER PUBLICATIONS

Yu Kou, Low-Density Parity-Check Codes Based on Finite Geometries: A Rediscovery and New Results, IEEE Transactions on Information Theory, vol. 47, No. 7, Nov. 2001, 26 pages (Year: 2001).*

(Continued)

*Primary Examiner* — Tung S Lau

(57) ABSTRACT

A method for operating a component of predetermined geometry $\Omega$ that is cyclically loaded during operation, wherein a probability of failure P is determined for the component taking account of distributions of failure times, which are caused by deviations in material properties, the component is operated depending on the determined probability of failure P, wherein at least one maintenance time is set for the component, in particular depending on the determined probability of failure P.

8 Claims, 4 Drawing Sheets

(51) Int. Cl.
*G01B 11/24* (2006.01)
*G01M 15/14* (2006.01)
*G06N 7/00* (2006.01)

(58) Field of Classification Search
CPC ............... G05B 19/048; G01B 11/005; G01B 11/2441; G01M 15/14; G06N 7/005; G06F 30/23
See application file for complete search history.

(56) References Cited

U.S. PATENT DOCUMENTS

| | | | |
|---|---|---|---|
| 6,910,942 B1 * | 6/2005 | Dornfeld | B24B 37/013 |
| | | | 451/285 |
| 7,243,045 B2 | 7/2007 | Uwatoko et al. | |
| 9,587,928 B2 | 3/2017 | Przygodda et al. | |
| 9,792,955 B2 | 10/2017 | Guan et al. | |
| 2010/0235109 A1 | 9/2010 | Zhao et al. | |
| 2017/0173262 A1 * | 6/2017 | Veltz | A61B 5/0022 |
| 2018/0164427 A1 * | 6/2018 | Palmer-Smith | G01S 13/524 |
| 2019/0008057 A1 * | 1/2019 | Jensen | H05K 5/0026 |

FOREIGN PATENT DOCUMENTS

| | | | | |
|---|---|---|---|---|
| CN | 104620074 A | | 5/2015 | |
| CN | 105404756 A | | 3/2016 | |
| CN | 106484996 | * | 3/2017 | ............ G06F 30/23 |
| CN | 106649975 | * | 5/2017 | ............ G06F 30/23 |
| CN | 106649976 | * | 5/2017 | ............ G06F 30/13 |
| DE | 102007002801 A1 | | 7/2008 | |
| EP | 2835706 A1 | | 2/2015 | |
| EP | 2857914 A1 | | 4/2015 | |
| JP | 2001125933 A | | 5/2001 | |
| JP | 2001289771 A | | 10/2001 | |
| JP | 4538845 B2 | | 9/2010 | |
| KR | 1020150103021 A | | 9/2015 | |
| WO | 2015071107 A1 | | 5/2015 | |

OTHER PUBLICATIONS

Ralf H. Reussner, Reliability prediction for component-based software architectures, 2002 Elsevier Science Inc. All rights reserved, 12 pages (Year: 2002).*

Risk estimation for LCF crack initiation von S. Schmitz, G. Rollmann und H. Gottschalk, preprint (2012), arXiv: 1302.2902; 2012.

Optimal reliability in design for fatigue life von H. Gottschalk und S. Schmitz, preprint(2012), arXiv: 1210.4954; 2012.

PCT International Search Report and Written Opinion of International Searching Authority dated Feb. 22, 2018 corresponding to PCT International Application No. PCT/EP20171078045 filed Nov. 2, 2017.

Bittner, Laura et al: "Optimal Reliability for Metal Components under Cyclic Loading"; Bergische Uniyersität Wuppertal, XP055708659.

\* cited by examiner

FIG. 4

```
determining a probability of failure P for the component
taking account of distributions of failure times, which are
caused by deviations in material properties
```
↓
```
operating the component depending on the determined probability of
failure P, wherein at least one maintenance time is set for the component,
depending on the determined probability of failure P, wherein the
probability of failure P is determined taking additional account of
distributions of failure times, which are caused by deviations of the
component form from a standard geometry, wherein data that were
obtained by determining the geometry of a predetermined number of
representative components by metrology are resorted to for the purposes
of taking account of the form deviation from the standard geometry,
wherein the probability of failure P is determined according to the formula
```
↓

$$P(t) \approx 1 - \frac{e^{-t^m(J+\Delta J)+\frac{1}{2}t^{2m}\sigma^2}\left(1 - \Phi\left(t^m\sigma - \frac{J \pm \Delta J}{\sigma}\right)\right)}{1 - \Phi\left(-\frac{J \pm \Delta J}{\sigma}\right)},$$

↓ with the coordinate vector X of all nodes of the finite element model of the geometry $\Omega$ of the component, the discretized objective functional $J(X) = J(X, U(X))$ for LCF (low cycle fatigue) or for another fault mechanism, the number of load cycles t, a form parameter of the Weibull distribution m, the error function, which is the distribution function of the standard normal distribution $\Phi(t)$, and with $J = J(X_d)$, where Xd is the standard position of the nodes in the standard geometry, and with $\Delta J = (dJ/dX)'\overline{\Delta X}$ with the mean process deviation $\overline{\Delta X}$ and with $\sigma^2 = (dJ/dX)'C(dJ/dX)$ with the process distribution C.

METHOD FOR OPERATING A COMPONENT THAT IS CYCLICALLY LOADED DURING OPERATION

CROSS REFERENCE TO RELATED APPLICATIONS

This application is the US National Stage of International Application No. PCT/EP2017/078045 filed Nov. 2, 2017, and claims the benefit thereof. The International Application claims the benefit of German Application No. DE 10 2016 221 928.6 filed Nov. 9, 2016. All of the applications are incorporated by reference herein in their entirety.

FIELD OF INVENTION

The invention relates to a method for operating a component of predetermined geometry $\Omega$ that is cyclically loaded during operation, wherein—a probability of failure P is determined for the component taking account of distributions of failure times, which are caused by deviations in material properties, —the component is operated depending on the determined probability of failure P, wherein at least one maintenance time is set for the component, in particular depending on the determined probability of failure P.

BACKGROUND OF INVENTION

The safe operation of mechanical components that are exposed to cyclical thermomechanical loads during operation is very important in different fields. Gas turbine rotor blades and guide vanes, rotor components and the like, which find use both in the field of aircraft operation and in the operation of gas-fired power plants, are mentioned as examples of such components. Here, the period of time during which a component can be reliably operated or the expected time of failure of a component is of particular interest. However, it was found that failure times for mechanical components are only predictable with difficulty and are subject to a significant distribution in respect of the time of the first failure. However, the probability of failure (PoF) must be kept low during operation in order to restrict the economic and functional safety risk, as is described, for example, by standards, for instance ISO 21789 for gas turbine safety or FAA (Federal Aviation Administration) regulations for the field of aircraft operation.

If the components are subject to cyclical thermal and mechanical loads during operation, this leads to fatigue in the employed materials and hence leads to the formation of cracks, which restricts the component service life in many cases. Here, the so-called low cycle fatigue (LCF) of the components is of particular importance.

Components are usually designed on the basis of material curves, as may be obtained by material tests on standardized samples, for example. Here, the deterministic consideration of the component failure dominates. Until now, a probability of failure, in particular a probability of crack initiation, was not calculated in the majority of cases. Instead, blanket safety factors are only taken into account by way of fixed reductions in the admissible component service life, without quantitative calculations being made. However, this is consequently accompanied by the disadvantage that components are replaced or serviced in part an unnecessarily long time before they reach their actual service life, reducing the efficiency of the machines or installations comprising the components. A further problem of this procedure based merely on rough estimates consists of the fact that, on account of specific properties, a component may already fail before a failure time predicted in this way, which is then connected with downtimes and the associated significant economic disadvantages.

Therefore, efforts were made in the prior art in respect of finding options for the more accurate prediction of component failure.

A distribution of the failure times on account of the material properties of the components is described in the articles "Optimal reliability in design for fatigue life" by H. Gottschalk and S. Schmitz, preprint (2012), arXiv: 1210.4954 and "Risk estimation for LCF crack initiation" by S. Schmitz, G. Rollmann and H. Gottschalk, preprint (2012), arXiv: 1302.2902 and in EP 2 835 706 A1. In this case, important material properties are, for example, the Young's modulus present locally and grain sizes which, inter alia, depend on the individual casting and manufacturing process.

Here, the probability of failure in relation to the low cycle fatigue (LCF) for a given number n of load cycles is determined by the formula $$P(t \mid X) = 1 - e^{-t^m J(X)},$$

where $$J(X) = J(X, u(X)) = \int_{\partial \Omega} \left( \frac{1}{N_{det}(u)} \right)^m dA.$$

Here, $\Omega$ denotes the material-filled region in three-dimensional space, $\partial \Omega$ is the interface, dA is the surface integral and m is a Weibull form parameter. Further, X is the coordinate vector of all nodes of the finite element model of $\Omega$. $N_{det}(u)$ is a scaling variable that depends on the local stress tensor field of the finite element solution u of the displacement field. The aforementioned expression can be calculated numerically using a finite element analysis (FEA) solution of the stress tensor field and a specific FEA postprocessor, as emerges from the two articles cited above.

In principle, this procedure has proven its worth. In particular, an operation with increased safety and cost effectiveness in relation to the previously known procedures can be obtained because a probability of failure is determined instead of only approximate generalities being formulated. However, there is a need for further improved methods.

SUMMARY OF INVENTION

Proceeding from the prior art, it is therefore an object of the present invention to develop a method of the type set forth at the outset in such a way that it facilitates an operation of a component or of an installation or machine comprising the component with increased safety and increased cost effectiveness in relation to the prior art.

In a method of the type set forth at the outset, this object is achieved by virtue of the probability of failure P being determined taking additional account of distributions of failure times, which are caused by deviations of the component form from a standard geometry, wherein, in particular, data that were obtained by determining the geometry of a predetermined number of representative components by metrology are resorted to for the purposes of taking account of the form deviation from the standard geometry, wherein the probability of failure P is determined according to the formula $$P(t) \approx 1 - \frac{e^{-t^m[J+\Delta J]+\frac{1}{2}t^{2m}\sigma^2}\left(1-\Phi\left(t^m\sigma - \frac{J+\Delta J}{\sigma}\right)\right)}{1-\Phi\left(-\frac{J+\Delta J}{\sigma}\right)},$$

with the coordinate vector X of all nodes of the finite element model of the geometry $\Omega$ of the component, the discretized objective functional $J(X)=J(X,U(X))$, for LCF (low cycle fatigue) or for another fault mechanism, the number of load cycles t, a form parameter of the Weibull distribution m, the error function, i.e., the distribution function of the standard normal distribution $\Phi(t)$, and with $J=J(X_d)$, where $X_d$ is the standard position of the nodes in the standard geometry, and with $\Delta J=(dJ/dX)'\overline{\Delta X}$ with the mean process deviation $\overline{\Delta X}$ and with $\sigma^2=(dJ/dX)'C(dJ/dX)$ with the process distribution C.

Expressed differently, the present invention is based on the discovery that, in addition to a distribution in the material properties of different specimens of a given component, deviations of the actual component geometry from the predetermined intended or standard geometry also have a significant influence on the distribution of the failure times. Such geometry deviations are always present since each production method is subject to certain manufacturing tolerances. By way of example, when producing components by casting, a completely manufactured component always differs to a certain extent from the intended or standard geometry that serves as a template for the manufacturing process, for example in the form of a CAD data record. How great the deviations are may depend on a multiplicity of parameters and may, in particular, differ between producers.

According to the invention, there is an integrated assessment of the probability of failure, with distributions in the failure times caused both by material properties and by production tolerances being considered in combination. As a consequence thereof, a particularly accurate determination of probabilities of failure becomes possible and it is possible to ensure a particularly safe and economic operation, for example of a machine or installation comprising a relevant component.

Here, the probability of failure P is understood to mean the probability of crack initiation.

In particular, a safe operation of gas turbines, or else of other mechanical components that are subject to cyclical thermomechanical loads during operation, can be implemented on the basis of calculated risk values.

Further, it is possible to determine servicing intervals particularly reliably for such components, or installations or machines comprising the latter, on the basis of acceptable risk criteria. Misjudgments of the component failure are reliably avoided.

Moreover, producers or purveyors of gas turbines and other mechanical components can be qualified on the basis of the growth of the probability of failure that is caused by the production tolerances of the corresponding purveyors.

This has not been possible previously since production tolerances of purveyors were determined only by way of the demands set in ISO 2768-1, for example, which were not related to the probability of failure, however.

According to the invention, the procedure known in advance from the prior art, according to which the probability of failure is determined only by taking account of the distribution by the material properties, is expanded. The expansion is such that, in particular, average geometry deviations and the distribution in the geometries are additionally taken into account in the formula for the probability of failure. These variables are advantageously measured during or after the production process for a predetermined number of representative components, wherein, in particular, use is made of a coordinate measuring machine, which may comprise a white light interferometer or be formed by the latter.

The capture of the actual component geometry of the representative components by metrology for the purposes of taking account of the geometry distribution can be carried out by the component producer, in particular, who readily has access to a number of structurally identical components that are manufactured under the same conditions. By way of example, use can be made of geometry data that are captured or were already captured in any case by the producer within the scope of quality control, for example for samples of produced components. As an alternative or in addition thereto, the customer, i.e., the buyer of the components, may also capture the geometry of the measured components. By way of example, the geometry can then be measured by the customer after the latter has received the goods. The data captured by the customer in any case within the scope of their incoming goods control can also be used as data captured by the customer.

The representative components to be measured must be suitable for supplying representative values for the geometry deviation; i.e., they should have the same form and should have been produced by the same producer by the same production methods, such as the same heat treatment, for example.

It is understood that it is both possible to use geometry data of samples only, i.e., of only some of all components of one form manufactured by a producer, and possible to use geometry data of all components, i.e., to carry out a full measurement and directly include the results thereof in the determination of the probability of failure according to the invention.

One embodiment of the method according to the invention is distinguished in that each of the representative components was measured using a coordinate measuring machine, which advantageously comprises a white light interferometer or is formed by the latter, for the purposes of determining the geometry of the representative components by metrology.

In particular, a set of coordinate points $x_{ij}$ is or was obtained by determining the geometry of the representative components by metrology, where i specifies the respectively measured component and j specifies a respectively measured standard point. The coordinates $x_j$ are or were advantageously obtained from a CAD data record that represents the standard geometry of the components.

Further, the coordinates can be chosen as surface mesh points of a finite element analysis (FEA) mesh, for example.

The following applies in respect of the derivation of the equation according to the invention for the probability of failure P.

The starting point is a probability of failure over a number of load cycles t of the form $$P(t|X)=1-e^{-t^m J(X)}.$$

Here, X is the geometric information item (the node set) of the finite element model of a mechanical component, $J(X)=J(X,U(X))$ is the discretized objective functional for the low cycle fatigue (LCF) or for another fault mechanism and $X_d$ is the default position of the nodes, i.e., the node set, which is obtained from the standard geometry which, in particular, may be present as CAD geometry.

In a first step, the form deviation $$\frac{dJ(X_d)}{dX}$$

is calculated using the adjoint method, specifically according to the method that was published in the final report of AG Turbo 2020, entitled "Sensitivität der Ausfallwahrscheinlichkeit für thermisch und mechanisch belastete Gasturbinenkomponenten mittels adjungierter Verfahren" by Hanno Gottschalk, Stefan Kalisch, Mohamed Saadi, Teilverbundprojekt in Expansion, Vorhabensgruppe 4.1—Gas und Dampfturbinenschaufeln, Vorhaben-Nr.: AG Turbo 20204.1.13. This final report was accessioned in the technical information library (TIP) Hanover under the shelf mark F16B381.

Then, a Taylor expansion is carried out to first order $$J(X) \approx J(X_d) + \left(\frac{dJ(X_d)}{dX}\right)'(X - X_d).$$

The assumption is made that X is a random variable. X is advantageously measured using a coordinate measuring machine, in particular using a white light interferometer; advantageously, the surface geometry of representative components is scanned. This can include potential mesh morphing in relation to the interior nodes. In the case of mesh morphing, the interior nodes of a finite element mesh are likewise displaced depending on the displacement of the surface nodes. This serves to ensure the mesh quality of the FEA not being impaired by the deformation of the form. Usual methods are, e.g., elliptical mesh smoothers which, in turn, are based on FEA methods.

Furthermore, $X_0$ is the mean deviation (i.e., the systematic geometry displacement in the production process of the components) and C is the covariance of X (which represents the distribution in the production process).

Proceeding from the coordinates $x_{ij}$ captured by metrology for a predetermined number of representative components, the mean production process deviation at the point j is advantageously determined by $$\overline{\Delta x_j} = (1/n)\Sigma_i(x_{ij} - x_i) = (1/n)\Sigma_i \Delta x_{ij}.$$

In particular, the covariance matrix of the deviations is further advantageously determined by $$c_{jk} = (1/(n-1))(1/n)\Sigma_i(\Delta x_{ij} - \overline{\Delta x_j})(\Delta x_{ik} - \overline{\Delta x_{ik}}).$$

Here, n represents the number of measured components.

Then, in a next step, an individual random deviation vector $\Delta X = (\Delta x_i)$ can be considered. A normal distribution $\Delta X \sim N(\Delta x, C)$ can be assumed for this deviation.

The following is obtained: $P(t) = \mathbb{E}_x[P(t,X)]$.

Attempts were made to evaluate this formula by applying the first order Taylor expansion. However, it was found that the linear approach using the covariance transformation formula, together with the known Laplace transform for Gaussian random variables $$P(t) \approx 1 - \mathbb{E}_x\left[e^{-t^m\left[J(X_d) + \left(\frac{dJ(X_d)}{dX}\right)'(X - X_d)\right]}\right] = e^{-t^m[J + \Delta J] + \frac{1}{2}t^{2m}\sigma^2}$$

with $$J = J(X_d), \Delta J = \left(\frac{dJ(X_d)}{dX}\right)'(X - X_d)$$

and $$\sigma^2 = \left(\frac{dJ(X_d)}{dX}\right)' C \frac{dJ(X_d)}{dX},$$

did not lead to a satisfactory result. It was found that the survival probability becomes larger, the greater the first order influence is on the process distribution for the component survival probability.

Moreover, negative values of P(t) result for large t. As a consequence of these deficits, this equation for P(t) is not suitable for industrial application.

An in-depth analysis has yielded that the problem is related to the negative values of $$J(X) \approx \left[J(X_d) + \left(\frac{dJ(X_d)}{dX}\right)'(X - X_d)\right],$$

which occur with some (a small) probability as a consequence of the unbound Gaussian fluctuations of X. Negative (approximate) values of J(X) no longer correspond to a Weibull distribution.

According to the invention, this was counteracted by excluding such pathological values by conditioning to $$\left[J(X_d) + \left(\frac{dJ(X_d)}{dX}\right)'(X - X_d)\right].$$

The error made by this conditioning is conservative, i.e., it leads to the prediction of excessively high probabilities of failure (provided that a first order Taylor expansion is justified). Low J(X) values leading to lower probability of failures stand behind this. Consequently, negative J(X) values represent a "longer than infinite" life, which is cut off by the conditioning. It is noted that the approximation error as a consequence of the first order Taylor expansion should be assessed with different justifications. An assessment should be carried out as to whether the process distribution is in fact sufficiently small that the Taylor expansion is justified and that no nonlinear effects in the deformation variables $(X - X_d)$ occur when changing the probability of failure.

Hence, a new approximated formula is obtained:

$$P(t) \approx 1 - \mathbb{E}_x\left[e^{-t^m\left[J(X_d) + \left(\frac{dJ(X_d)}{dX}\right)'(X - X_d)\right]} \Big| \left[J(X_d) + \left(\frac{dJ(X_d)}{dX}\right)'(X - X_d)\right] > 0\right].$$

In a next step, the expression on the right-hand side is evaluated. A start is made by $$P\left(\left[J(X_d) + \left(\frac{dJ(X_d)}{dX}\right)'(X - X_d)\right] > 0\right) = 1 - \Phi\left(-\frac{J + \Delta J}{\sigma}\right),$$

which is obtained by standardization. Here, $\Phi(t)$ represents the error function, i.e., the distribution function of the standard normal distribution.

In the next step, the following is obtained by direct calculation using quadratic completion $$(t^m\sigma)^2 + 2t^m y + (y/\sigma)^2 = (t^m\sigma + (y/\sigma))^2 = \bar{y}^2$$

and a change in variable $y \to \bar{y}$ $$\mathbb{E}_x\left[e^{-t^m[J(X_d)+(\frac{dJ(X_d)}{dX})'(X-X_d)]}1_{\{J(X_d)+(\frac{dJ(X_d)}{dX})'(X-X_d)>0\}}\right] =$$

$$e^{-t^m[J+\Delta J]}\frac{1}{\sqrt{2\pi}\,\sigma}\int_{-(I+\Delta I)}^{\infty}e^{-t^m y}e_2^{-\frac{1}{2}\left(\frac{y}{\sigma^2}\right)^2}dy =$$

$$e^{-t^m[J+\Delta J]+\frac{1}{2}t^{2m}\sigma^2}\left(1 - \Phi\left(t^m\sigma - \frac{J+\Delta J}{\sigma}\right)\right).$$

Here, $1_A$ is the indicator function for the set A. Consequently, the following is obtained as final result for the approximated formula $$P(t) \approx 1 - \frac{e^{-t^m[J+\Delta J]+\frac{1}{2}t^{2m}\sigma^2}\left(1 - \Phi\left(t^m\sigma - \frac{J+\Delta J}{\sigma}\right)\right)}{1 - \Phi\left(-\frac{J+\Delta J}{\sigma}\right)},$$

where $\Delta J = (dJ/dX)'\overline{\Delta X}$ and $\sigma^2 = (dJ/dX)'C(dJ/dX)$.

According to the invention, this adapted formula is used to take account of the mean process deviations $\overline{\Delta X}$ and the process distribution C for the purposes of determining the probability of failure.

Consequently, the invention comprises a combination of a probabilistic failure-time model, an adjoint method for calculating form sensitivities, a capture of production deviations by metrology, in particular using coordinate measuring machines, the interpolation of the normal deviations of a finite element mesh X, the static evaluation of a plurality of such measurements with mean and covariance, which correspond to a systematic deviation and a distribution of the production process, and the use of the formula according to the invention for the probability of failure for the purposes of calculating the probability of crack initiation after a given number of load cycles t, taking account of the distribution of the material properties, the distribution of the production process and the process deviations, in particular of turbine blade casting.

The solution according to the invention for the aforementioned problem is highly efficient since only one further finite element solution for the adjoint state is required in relation to the prior art.

In a development of the method according to the invention, provision is made for a limit to be set for the probability of failure P, said limit determining the time at which the probability of failure will reach the limit and this time being set as maintenance time. By way of example, it is possible to set a maximum acceptable probability of failure, which may lie at 10%, for example; under this assumption, it is possible to determine the number of cycles after which this value is reached. Then, a maintenance time is advantageously set to a time immediately after reaching the number of cycles.

As an alternative or in addition thereto, a decision as to whether the production process of the component satisfies sufficiently stringent quality requirements for a specified application of the component can be made on the basis of the determined probability of failure P. By way of example, use can be made of data, in particular coordinate sets $x_{ij}$, for a predetermined number of representative components that were produced by different producers and, using the formula according to the invention, the probability of failure P can be determined for each producer depending on the number of cycles. The values obtained can be compared among themselves and/or to predetermined limits and a decision can be made on the basis of the comparison as to whether or not the with producers meet desired quality requirements.

The component that is operated according to the method according to the invention is, for example, a component of a gas turbine or a steam turbine or of a generator or of a jet engine or of a shaft or of an aircraft wing.

It is understood that only a single component, a plurality of components or else all components of a machine or installation can be operated according to the method according to the present invention.

BRIEF DESCRIPTION OF THE DRAWINGS

Further features and advantages of the present invention are elucidated on the basis of the following description of a method for operating a component according to an embodiment of the present invention, with reference being made to the attached drawing. In the drawing:

FIG. 4 is flow chart illustrating the operation of a method substantially as recited in claim 1.

DETAILED DESCRIPTION OF INVENTION

Figure 1:
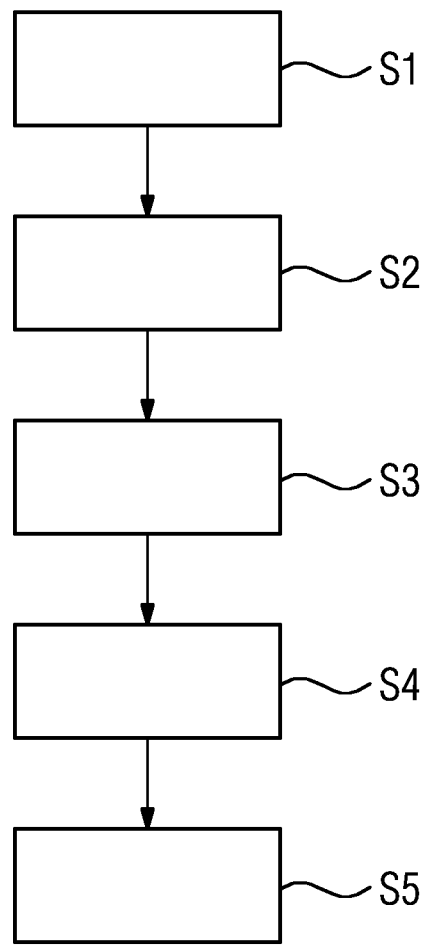
FIG. 1 is an exemplary embodiment of the method according to the invention as a flowchart.

The method according to the invention for operating a component according to the illustrated exemplary embodiment starts in a first step S1 with the provision of a component of predetermined geometry $\Omega$ that is cyclically loaded during operation, said component in the present case being a rotor blade, not illustrated in the figures, of a gas turbine that is likewise not illustrated.

Geometry data that were obtained by determining the geometry $\Omega$ of a predetermined number of in this case 100 representative components by metrology are provided in a second step S2. The representative components, which are likewise rotor blades, are distinguished by the same geometry as the component provided in step S1—with the exception of production tolerances—and were produced by the same producer and in the same production method.

The data provided for the representative components are, specifically, a set of coordinate points $x_{ij}$, said set having been created by virtue of each of the representative 100 components having been measured by means of a coordinate measuring machine, a white light interferometer in the present case, at a predetermined number of standard points. Here, i denotes the respectively measured component and j denotes the respective standard point. Consequently, $x_{ij}$ represents a vector in three-dimensional space. The corresponding coordinates $x_j$ of the standard or intended geometry of the representative components were obtained by a CAD program, specifically in the form of a CAD data record of the component geometry provided for the production. Here, the coordinates were chosen as surface grid points of a finite element analysis (FEA) mesh. The geometry data for the representative components, captured by metrology, were captured by the producer of the provided component immediately after the production of the representative components using the white light interferometer.

In a next step S3, the mean geometry deviation at the point j is calculated from the set of coordinates provided for the representative components by $$\overline{\Delta x_j} = (1/n)\Sigma_i(x_{ij}-x_j) = (1/n)\Sigma_i \Delta x_{ij}$$

and the covariance matrix of the deviations is calculated by $$c_{jk} = (1/(n-1))(1/n)\Sigma_i(\Delta x_{ij}-\overline{\Delta x_j})(\Delta x_{ik}-\overline{\Delta x_{ik}}).$$

A single random deviation vector $\Delta X = (\Delta x_i)$ is considered. A normal distribution) $\Delta X \sim N(\phi x, C)$ can be assumed for this deviation.

Subsequently, a probability of failure P for the provided component is determined in step S4 using the formula $$P(t) \approx 1 - \frac{e^{-t^m[J+\Delta J]+\frac{1}{2}t^{2m}\sigma^2}\left(1 - \Phi\left(t^m\sigma - \frac{J+\Delta J}{\sigma}\right)\right)}{1 - \Phi\left(-\frac{J+\Delta J}{\sigma}\right)}$$

according to the invention, with $\Delta J = (dJ/dX)^t \overline{\Delta X}$ and $$\sigma^2 = (dJ/dX)^t C(dJ/dX).$$

Here, m=1.5 is chosen within the scope of the present exemplary embodiment, which lies in the range of the Weibull form parameters of the probabilistic low cycle fatigue (LCF). Furthermore, $J=(1/3000)^m$ is formulated for the present example, which corresponds to 3000 cycles as the $$1 - \frac{1}{e} \approx 0.63$$

guanine of the Weibull distribution of the probability of failure of the standard geometry. Further, the assumption is initially made that $\Delta J=0$, meaning that the production process is centered about the standard geometry, that is to say $X_d = X_0$, i.e., the geometry deviations of the 100 representative components from the CAD standard geometry have a mean of zero.

Finally, $\sigma = 0.6*J$ is assumed, meaning that the 1$\sigma$ distribution in $J(X)$ is 60% of the absolute $J=J(X_d)$ value, which factors in approximately 5% of the cases with the negative approximation for $J(X)$.

Figure 2:
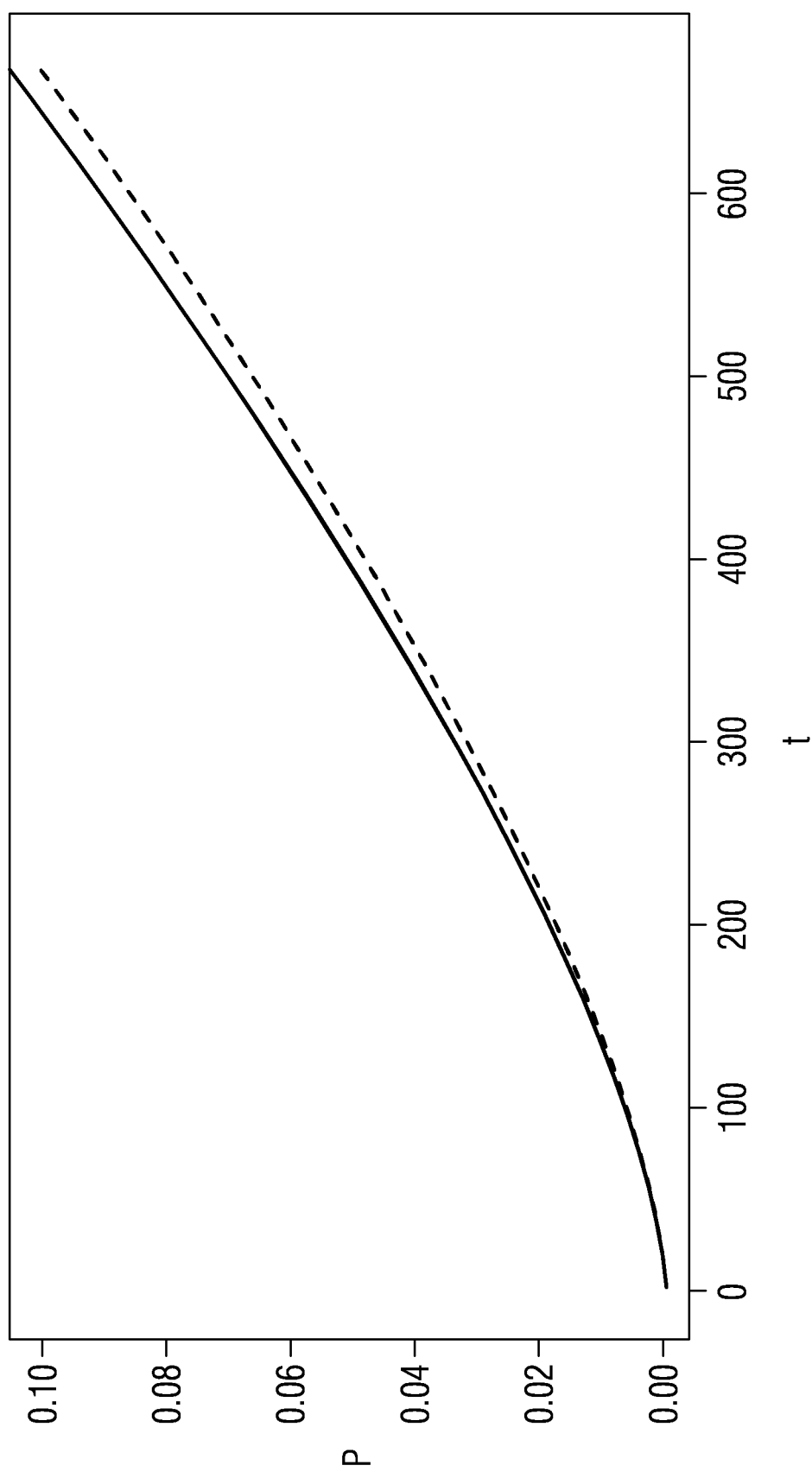
FIG. 2 is a graph, in which the probability of failure P is plotted over the number t of load cycles for a standard geometry and for a distributed geometry.

FIG. 2 illustrates, by way of the full line, the resultant probability of failure P(t) over the number of cycles t. The probability of failure P(t), which arises without the consideration of the geometry distribution according to the invention, is likewise plotted, specifically using the dashed line. This probability of failure P has been calculated according to the formula known in advance from the prior art, which only takes account of the distribution as a consequence of material properties but not that as a consequence of geometry deviations (cf. EP 2 835 706 A1).

At first sight, taking account of the geometry distribution according to the invention appears to lead to moderate deviations. However, if the assumption is made that the maximum acceptable risk for LCF crack initiation lies at a probability of failure of 10%, a cycle number of t=670 is obtained when only taking account of the distribution as a consequence of material properties. By contrast, in the case of the additional consideration of the geometric distribution according to the invention, a cycle number of t=648 arises. The maximum acceptable probability of failure according to the exemplary embodiment is therefore already reached 22 cycles earlier. The fact that 22 cycles represent a significant economic value highlights the importance of the apparently moderate change as a consequence of the procedure according to the invention.

In a last step S5, the provided component is operated depending on the determined probability of failure. Specifically, maintenance of the component being carried out when the maximum tolerable probability of failure of 10% has been reached, i.e., after 648 cycles, is specified.

Since, according to the invention, the geometry distribution that leads to the maximum tolerable probability of failure being reached earlier is additionally taken into account when determining the probability of failure P, it is possible to ensure a particularly safe and particularly economic operation of the gas turbine comprising the considered rotor blade. This is because maintenance (planning) is implemented on the basis of calculated risk values, in which the distribution of the failure times as a consequence of the geometry distribution was also taken into account. Misjudgments of the component failure are reliably avoided.

It should be noted that the influence of the presence of a systematic deviation of the production process, which results in a systematic geometry deviation, on the probability of failure was found to be substantially more significant.

Figure 3:
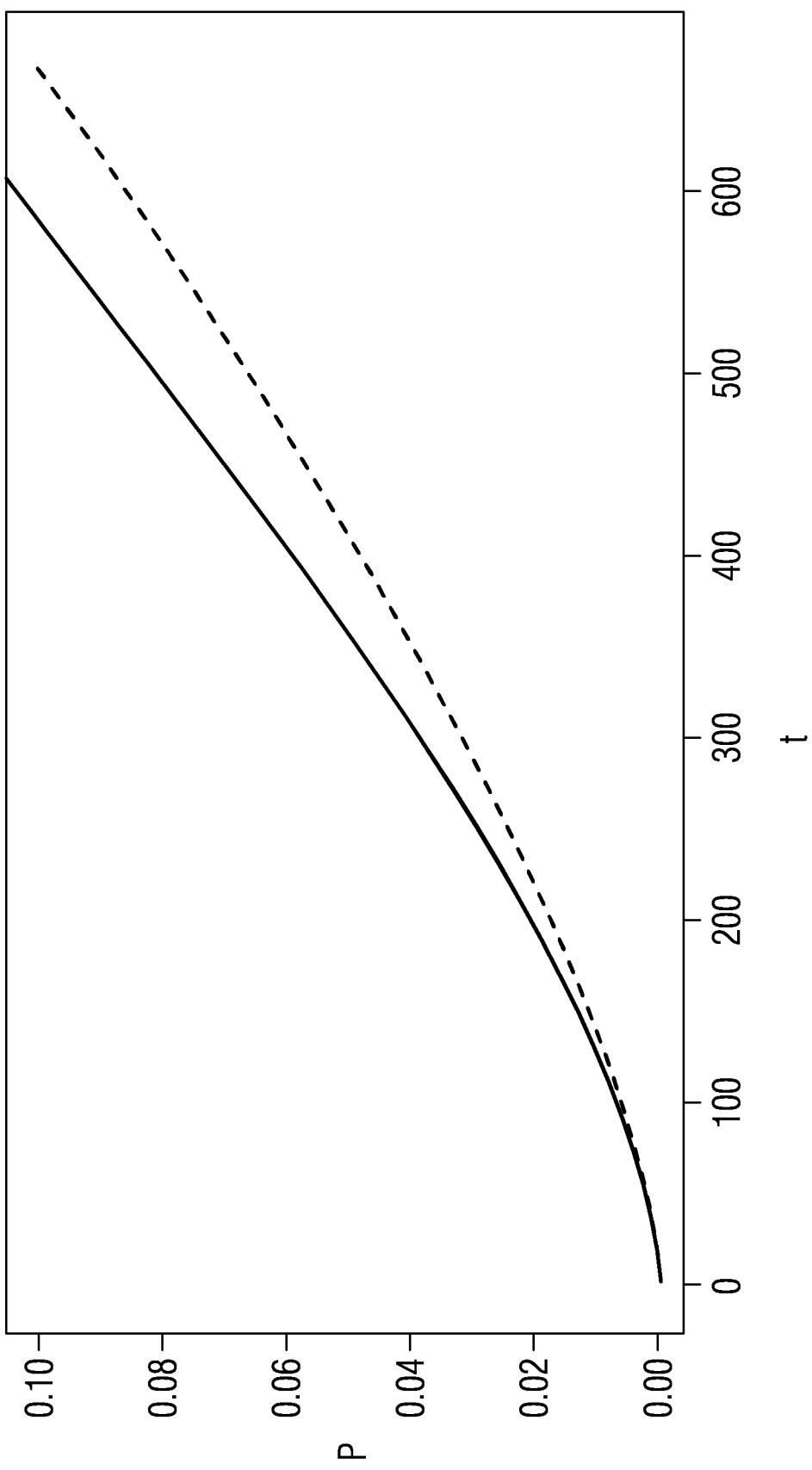
FIG. 3 is a graph, in which the probability of failure P is plotted over the number t of load cycles for a standard geometry and for a distributed geometry with a systematic displacement in J as a consequence of $\Delta J \neq 0$.

In order to elucidate this effect, the exemplary embodiment described above is modified in such a way that $\Delta J = 0.2*J$ is assumed instead of $\Delta J = 0$. This corresponds to a change of 10% in the J-value as a consequence of a difference of $X_0 - X_d$. The result can be gathered from FIG. 3, which once again illustrates the probability of failure P, once with additionally taking account, according to the invention, of the geometry distribution by way of the full line and once according to the prior art by way of the dashed line. It is possible to identify that the maximum acceptable probability of failure of 10% is now already reached at 568 cycles when the geometry distribution is additionally taken into account according to the invention and when there is a systematic deviation, i.e., for $\Delta J = 0.2*J$. Compared to the cycle number of 670 when the geometry distribution is not taken into account like in the present invention, the maximum acceptable probability of failure is already obtained 102 cycles earlier. This elucidates that the procedure according to the invention is of particular importance in the case where a systematic deviation in the component production process is present since only this allows significant misjudgments of the component failure to be avoided.

Even though the invention was illustrated more closely and described in detail by the preferred exemplary embodiment, the invention is not restricted by the disclosed examples and other variations can be derived therefrom by a person skilled in the art without departing from the scope of protection of the invention.

The invention claimed is:

1. A method for operating a component of predetermined geometry $\Omega$ that is cyclically loaded during operation, comprising:
   determining a probability of failure P for the component taking account of distributions of failure times, which are caused by deviations in material properties,
   operating the component depending on the determined probability of failure P, wherein at least one maintenance time is set for the component, depending on the determined probability of failure P,
   wherein the probability of failure P is determined taking additional account of distributions of failure times, which are caused by deviations of the component form from a standard geometry,
   wherein data that were obtained by determining the geometry of a predetermined number of representative components by metrology are resorted to for the purposes of taking account of the form deviation from the standard geometry,
   wherein the probability of failure P is determined according to the formula $$P(t) \approx 1 - \frac{e^{-t^m[J+\Delta J]+\frac{1}{2}t^{2m}\sigma^2}\left(1-\Phi\left(t^m\sigma - \frac{J+\Delta J}{\sigma}\right)\right)}{1-\Phi\left(-\frac{J+\Delta J}{\sigma}\right)},$$

with the coordinate vector X of all nodes of the finite element model of the geometry $\Omega$ of the component, the discretized objective functional $J(X)=J(X,U(X))$ for LCF (low cycle fatigue) or for another fault mechanism, the number of load cycles t, a form parameter of the Weibull distribution m, the error function, which is the distribution function of the standard normal distribution $\Phi(t)$, and with $J=J(X_d)$ where Xd is the standard position of the nodes in the standard geometry, and with $\Delta J=(dJ/DX)'\overline{\Delta X}$ with the mean process $\overline{\Delta X}$ deviation and with $\sigma_2=(dJ/dX)'C(dJ/dX)$ with the process distribution C.

2. The method as claimed in claim 1,
   wherein each of the representative components was measured using a coordinate measuring machine or a white light interferometer, for the purposes of determining the geometry of the representative components by metrology.

3. The method as claimed in claim 2,
   wherein a set of coordinate points xij was obtained by determining the geometry of the representative components by metrology, where i specifies the respectively measured component and j specifies a respectively measured standard point, wherein the coordinates xj were obtained, from a CAD data record that represents the standard geometry of the components.

4. The method as claimed in claim 3,
   wherein the coordinates are chosen as surface mesh points of a finite element analysis mesh.

5. The method as claimed in claim 3,
   wherein the mean production process deviation at the point j is determined by $$\overline{\Delta x_j}=(1/n)\Sigma_i(x_{ij}-x_j)=(1/n)\Sigma_i\Delta x_{ij}$$

and the covariance matrix of the deviations is determined by $$c_{jk}=(1/(n-1))(1/n)\Sigma_i(\Delta x_{ij}-\overline{\Delta x_j})(\Delta x_{ik}-\overline{\Delta x_{ik}}),$$

where i specifies the respectively measured component.

6. The method as claimed in claim 1,
   wherein a limit is set for the probability of failure P, said limit determining the time at which the probability of failure will reach the limit and this time being set as maintenance time.

7. The method as claimed in claim 1,
   wherein a decision as to whether the production process of the component satisfies sufficiently stringent quality requirements for a specified application of the component is made on the basis of the determined probability of failure P.

8. The method as claimed in claim 1,
   wherein the component is a component of a gas turbine or a steam turbine or of a generator or of a jet engine or of a shaft or of an aircraft wing.

* * * * *